United States Patent
Elhayani et al.

(10) Patent No.: US 9,806,640 B2
(45) Date of Patent: Oct. 31, 2017

(54) PIEZOELECTRIC TRANSMISSION SYSTEMS

(75) Inventors: Hovav Elhayani, Yokneam (IL); Gal Peled, Kibbutz Ein Hachoresh (IL); Tomer Saar, Haifa (IL); Nir Karasikov, Haifa (IL); Michael Trakhimovich, Gan Ner (IL); Eitan Rogel, Haifa (IL); Guy Rogel, Haifa (IL); Benny Gaber, Haifa (IL)

(73) Assignee: NANOMOTION LTD., Yoqne'am Ilit (IL)

( * ) Notice: Subject to any disclaimer, the term of this patent is extended or adjusted under 35 U.S.C. 154(b) by 1810 days.

(21) Appl. No.: 12/294,926

(22) PCT Filed: Mar. 15, 2007

(86) PCT No.: PCT/IL2007/000342
§ 371 (c)(1),
(2), (4) Date: Nov. 19, 2009

(87) PCT Pub. No.: WO2007/113794
PCT Pub. Date: Oct. 11, 2007

(65) Prior Publication Data
US 2010/0176689 A1   Jul. 15, 2010

Related U.S. Application Data

(60) Provisional application No. 60/787,355, filed on Mar. 30, 2006.

(51) Int. Cl.
*H01L 41/09* (2006.01)
*H02N 2/02* (2006.01)
(Continued)

(52) U.S. Cl.
CPC .............. *H02N 2/026* (2013.01); *F16D 3/56* (2013.01); *H01L 41/0913* (2013.01);
(Continued)

(58) Field of Classification Search
CPC ............................ H02N 2/026; H01L 41/0913
(Continued)

(56) References Cited

U.S. PATENT DOCUMENTS

| 5,616,980 | A | 4/1997 | Zumeris | |
| 6,373,170 | B1 * | 4/2002 | Hills | H02N 2/0055 310/323.18 |

(Continued)

FOREIGN PATENT DOCUMENTS

| EP | 0836266 A2 * | 4/1998 | ............. H02K 41/02 |
| WO | 00/74153 | 12/2000 | |

(Continued)

*Primary Examiner* — Thomas Dougherty
*Assistant Examiner* — Karen B Addison
(74) *Attorney, Agent, or Firm* — Mark David Torche; Patwrite Law

(57) ABSTRACT

Apparatus for transmitting motion to a moveable body comprising: a first bar having ends; two articulated arms, each comprising first and second arms connected at a joint having an axis about which the first and second arms rotate, wherein the first arms are of equal length, the second arms are of equal length and the second arm of each articulated arm is connected to a different end of the bar at a joint having an axis about which second arm and bar rotate; a mount connected to the first arm of each articulated arm at a joint having an axis about which first arm rotates; a second bar coupled to each articulated arm at a joint having an axis about which the second bar rotates; and a piezoelectric motor coupled to the first bar controllable to apply a force selectively in either direction along the bar's length; wherein, the joints are configured so that all the axes are substantially parallel and the first arms are parallel and the second arms are parallel for all rotations about the axes.

10 Claims, 14 Drawing Sheets

(51) Int. Cl.
  *F16D 3/56*   (2006.01)
  *H02N 2/00*   (2006.01)
  *H02N 2/04*   (2006.01)
(52) U.S. Cl.
  CPC .............. *H02N 2/006* (2013.01); *H02N 2/043* (2013.01); *Y10T 403/41* (2015.01)
(58) Field of Classification Search
  USPC ......... 310/323.17, 323.18, 328, 323.16, 348, 310/370; 74/99 R
  See application file for complete search history.

(56) References Cited

U.S. PATENT DOCUMENTS

| | | | | |
|---|---|---|---|---|
| 2004/0017134 A1* | 1/2004 | Ganor | ................ | H01L 41/0906 310/328 |
| 2006/0113866 A1* | 6/2006 | Ganor | ................ | H01L 41/0906 310/323.03 |

FOREIGN PATENT DOCUMENTS

| | | |
|---|---|---|
| WO | 01/33645 | 5/2001 |
| WO | 2004/012279 | 2/2004 |
| WO | 2006/035447 | 4/2006 |

\* cited by examiner

PIEZOELECTRIC TRANSMISSION SYSTEMS

RELATED APPLICATIONS

The present application is a US National Phase of PCT Application No. PCT/IL2007/000342, filed on Mar. 15, 2007, which claims the benefit under 35 U.S.C. 119(e) of U.S. Provisional Application 60/787,355, filed Mar. 30, 2006, the disclosures of which are incorporated herein by reference.

FIELD OF THE INVENTION

The invention relates to transmission systems for transmitting kinetic energy from a piezoelectric motor to a moveable body.

BACKGROUND OF THE INVENTION

Many applications require devices for accurately and rapidly controlling motion and positioning of a component, which may be relatively small and often delicate, of a mechanical, opto-mechanical and/or electromechanical system. For example, optical systems for use with cameras incorporated in cell phones often require transport systems for accurately moving and controlling the position of lenses and/or other components of the optical systems to provide various focusing and zooming functions. As cell phones become smaller and room available for these cameras shrinks, constraints on the size of transport systems for controlling position of the lenses and/or components, and accuracy and speed with which the transport systems perform, in general become more stringent.

Various piezoelectric motors are controllable to provide accurately controlled amounts of kinetic energy to mechanical systems and are therefore often suitable for use in such transport systems. For example, U.S. Pat. No. 5,616,980 to Zumeris et al, and PCT Publication WO 00/74153 entitled "Multilayer Piezoelectric Motor" describe piezoelectric motors that are capable of transmitting accurately controlled amounts of kinetic energy to move and position objects. Piezoelectric motors described in the referenced patent and PCT Publication comprise a relatively thin rectangular piezoelectric vibrator having large parallel face surfaces and narrow short and long edge surfaces. Optionally, a surface region of a short edge of the vibrator or a surface of a "friction nub" on a short edge of the vibrator functions as a motor coupling surface that is pressed to a contact surface of a moveable body. Electrodes on the face surfaces of the vibrator or, for piezoelectric motors described in WO 00/74153, on face surfaces of layers of the vibrator, are electrified to excite vibrations in the motor's friction nub that transmit kinetic energy to the moveable body via the body's contact surface. PCT Application PCT/IL00/00698 entitled "Piezoelectric Motors and Motor Driving Configurations" describes various piezoelectric motors and methods of coupling such motors to rotate moveable bodies. PCT Application PCT/IL03/00603 entitled "High Resolution Piezoelectric Motor" describes piezoelectric motors and methods of operating piezoelectric motors to position an object with relatively high accuracy. The disclosures of all the above referenced documents are incorporated herein by reference.

The piezoelectric motors described in these documents and similar piezoelectric motors are in general suitable to the tasks of rapidly and accurately moving and positioning an object if they can be provided with appropriate transmissions and devices for coupling them to the object that they are required to move.

SUMMARY OF THE INVENTION

An aspect of some embodiments of the present invention relates to providing a "coupled double-pendulum" transmission system in which a "motion" bar is suspended by two substantially identical articulated arms referred to hereinafter as "double-pendulums". The double-pendulums are coupled to enable the motion bar to translate easily parallel to its length without motion perpendicular to its length. A piezoelectric motor, optionally similar to a motor described in U.S. Pat. No. 5,616,980 referenced above, is coupled to the motion bar. Vibrations generated in the piezoelectric motor apply force to the motion bar to move the bar selectively along either direction parallel to the bar's length. The motion bar is coupled to a moveable body to move and position the moveable body.

An aspect of an embodiment of the invention relates to providing a "rail-rider" transmission system comprising a drive-rail and a piezoelectric motor housing adapted to move freely along the rail. A piezoelectric motor mounted in the housing is coupled to the drive-rail by action of a resilient component that is optionally an integral part of the housing or a resilient component mounted to the housing. Vibrations generated in the piezoelectric motor apply force to the drive-rail that moves the motor and thereby the housing selectively along either direction along the drive-rail. The housing is coupled to a moveable body to move and position the moveable body.

An aspect of some embodiments of the invention relates to providing a "pendulum" transmission system comprising an arm, referred to as a "pendulum" rotatable about an axis situated at a first end of the pendulum. A coupling plate having an optionally circularly cylindrical contact surface facing the axis is mounted to the pendulum at its second end. The cylindrical contact surface optionally has a center of curvature substantially coincident with the pendulum axis of rotation. A piezoelectric motor is optionally coupled to the cylindrical contact surface to rotate the pendulum selectively clockwise or counterclockwise about the axis of rotation. The coupling plate is optionally coupled to a moveable body to provide motion to and position the body. In an embodiment of the invention, the coupling plate is mounted to the moveable body by a resilient suspension system that moderates a tendency of rotational motion of the coupling plate to generate non-linear motion in the moveable body.

BRIEF DESCRIPTION OF FIGURES

Non-limiting examples of embodiments of the present invention are described below with reference to figures attached hereto. In the figures, which are listed following this paragraph, identical structures, elements or parts that appear in more than one figure are generally labeled with a same symbol in all the figures in which they appear. Dimensions of components and features shown in the figures are chosen for convenience and clarity of presentation and are not necessarily shown to scale.

DETAILED DESCRIPTION OF EXEMPLARY EMBODIMENTS

Figure 1A:
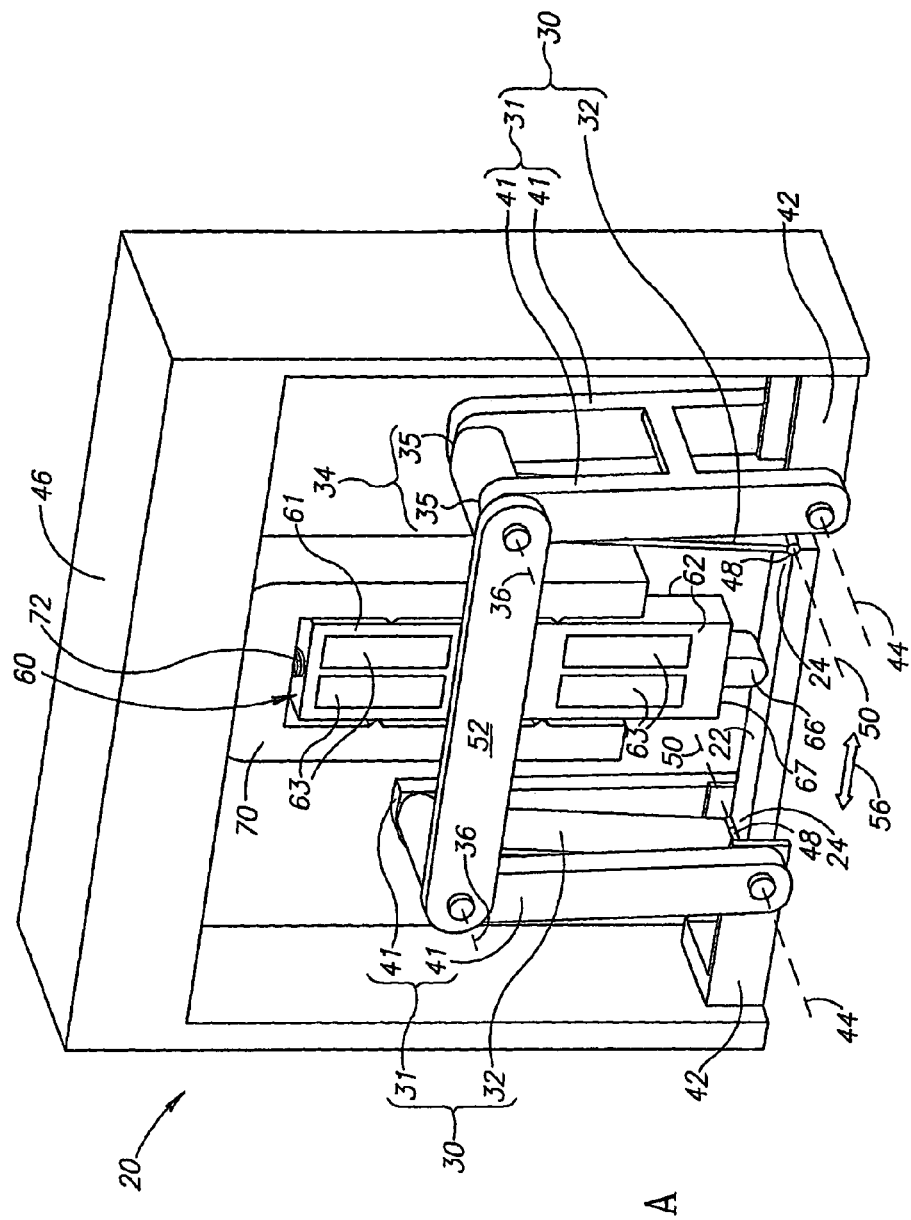
FIGS. 1A and 1B schematically show perspective and front views respectively of a coupled double-pendulum transmission system, in accordance with an embodiment of the present invention.
Figure 1B:
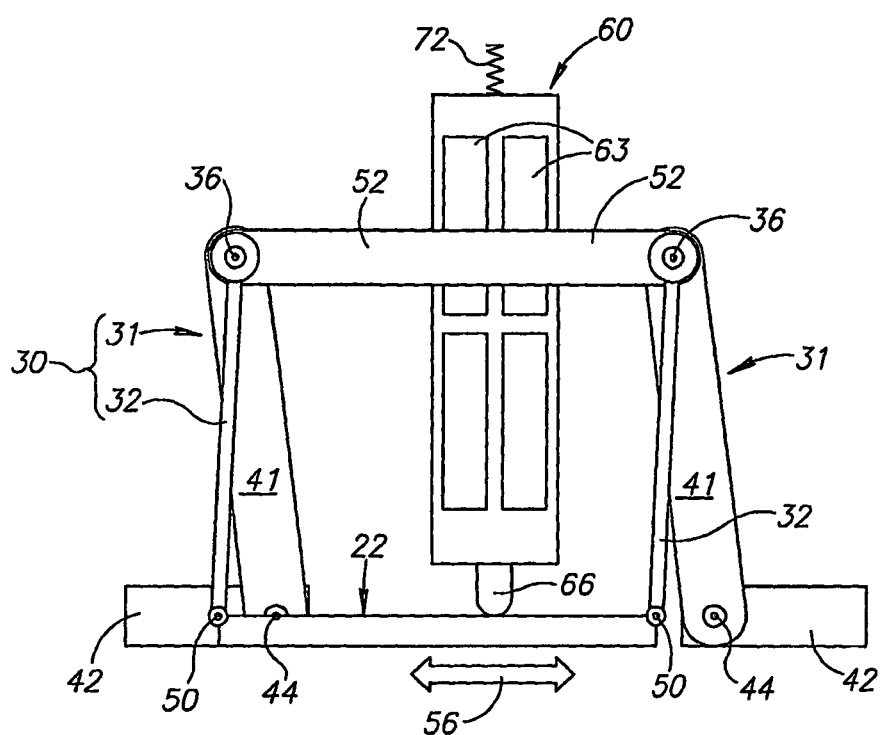

FIGS. 1A and 1B schematically show a perspective and side view respectively of a coupled double-pendulum transmission system 20 in accordance with an embodiment of the present invention. Parts of double-pendulum 20 shown in FIG. 1A are absent in FIG. 1B for convenience and clarity of presentation.

Transmission system 20 comprises a motion bar 22 having ends 24, each of which is suspended by optionally identical "double-pendulum" 30. Each double-pendulum 30 comprises a first pendulum arm 31 and a second pendulum arm 32 coupled at a joint 34 that allows the arms to rotate freely relative to each other about an axis indicated by a dashed line 36 in FIG. 1A and a center of a corresponding circle also labeled with the numeral 36 in FIG. 1B. First pendulum arm 31 optionally comprises two parallel, mirror image struts 41 and joint 34 optionally comprises a joint 35 at the end of each strut 41 that couples the strut to second pendulum arm 32.

Each strut 41 is coupled to an optionally "U" shaped pendulum mount 42 so that the strut and thereby first pendulum arm 31 rotate freely about an axis indicated by a dashed line 44 in FIG. 1A and a corresponding center of a circle also labeled with the numeral 44 in FIG. 1B. Each pendulum mount 42 is fixed to, or is an integral part of, a suitable transmission housing or frame 46. Each second pendulum arm 32 is coupled to an end 24 of motion bar 22 by a joint 48, shown by way of example as a hinge joint, which enables the second pendulum arm to rotate freely about an axis indicated by a dashed line 50. A distance between axes 50 is preferably equal to a distance between axes 36.

At least one coupling bar 52 couples double-pendulums 30. Optionally, the coupling bar is coupled to each double-pendulum at joint 34 so that the coupling bar is free to rotate about axis 36 and a distance between axes 36 is equal to a distance between axes 44. In the embodiment shown, coupling bar 52 constrains first pendulum arms 31 to be parallel to each other and second pendulum arms 32 to be parallel to each other for all relative rotations of the arms about axes 36 and/or axes 44. As a result, for rotations about these axes, the coupled double-pendulum suspension of motion bar 22 constrains the motion bar to be parallel to coupling bar 52. In particular, for first and second pendulum arms having substantially a same length, the coupled double-pendulum transmission 20 enables motion bar 22 to move freely in directions generally indicated by a double-head block arrow 56 with little if any motion in directions perpendicular to a plane that contains axes 36. For substantially equal length first and second arms 31 and 32, if the arms of a same double-pendulum 30 rotate by equal and opposite angles relative to their common axis 36 motion bar moves only in a direction parallel to block arrow 56 with substantially no motion perpendicular to a plane through the axes 36. The U shape of pendulum mounts 42 enable motion bar 22 to move in directions indicated by the double-head block arrow past axes 44.

At least one piezoelectric motor 60 is coupled to transmission system 20 by coupling the motor to motion bar 22 so that it is controllable to move the bar selectively in directions indicated by double-head block arrow 56. Piezoelectric motor 60 is optionally of a type described in U.S. Pat. No. 5,616,980 or PCT Publication WO 00/74153 referenced above, or variants thereof. By way of example, and for convenience of presentation, piezoelectric motor 60 in FIG. 1A and piezoelectric motors shown in other figures are similar to types of piezoelectric motors shown in U.S. Pat. No. 5,616,980. Other piezoelectric motors known in the art may be substituted for the types shown.

Piezoelectric motor 60 optionally comprises a thin rectangular piezoelectric vibrator 61 having two relatively large face surfaces 62 (only one of which is shown in FIG. 1A). One of face surfaces 62 optionally comprises four quadrant electrodes 63 that are located on the face surface in a symmetric checkerboard pattern. Optionally, a single large electrode (not shown) is located on the other face surface 62. Piezoelectric motor 60 optionally comprises a friction nub 66 on short edge surface 67 of vibrator 61, preferably located at the center of the edge surface. Friction nub 66 is optionally formed from a hard wear resistant material such as Alumina, stainless steel or a wear resistant high impact plastic such as PEEK (polyethyl ethyl ketone).

Piezoelectric motor 60 is coupled to motion bar 22 by resiliently urging the motor to the bar so that friction nub 66 presses against the bar. Any of various devices and methods known in the art may be used to resiliently urge piezoelectric motor 60 to motion bar 22. By way of example, in FIG. 1A piezoelectric motor 60 is schematically shown mounted to a "horseshoe" frame 70 mounted to transmission frame 46 and having a resilient member 72 that urges the motor towards motion bar 22 so that friction nub 66 presses resiliently against the bar.

Piezoelectric motor 60 is controlled to generate motion in friction nub 66 that applies force to motion bar 22 to move the motion bar selectively in either of the directions indicated by double-head block arrow 56. Any of various methods known in the art may be used to excite piezoelectric motor 60 to generate appropriate motion in friction nub 66. Optionally electrodes in the motor are electrified by an AC voltage to generate elliptical vibrations in friction nub 66 or are pulsed with unipolar voltage to generate a pulsed motion of the friction nub as described in U.S. Pat. No. 5,616,980 referenced above. For relatively small, accurately controlled displacements, piezoelectric motor 60 is optionally operated in a DC mode as described PCT Application PCT/IL03/00603 referenced above.

Figure 1C:
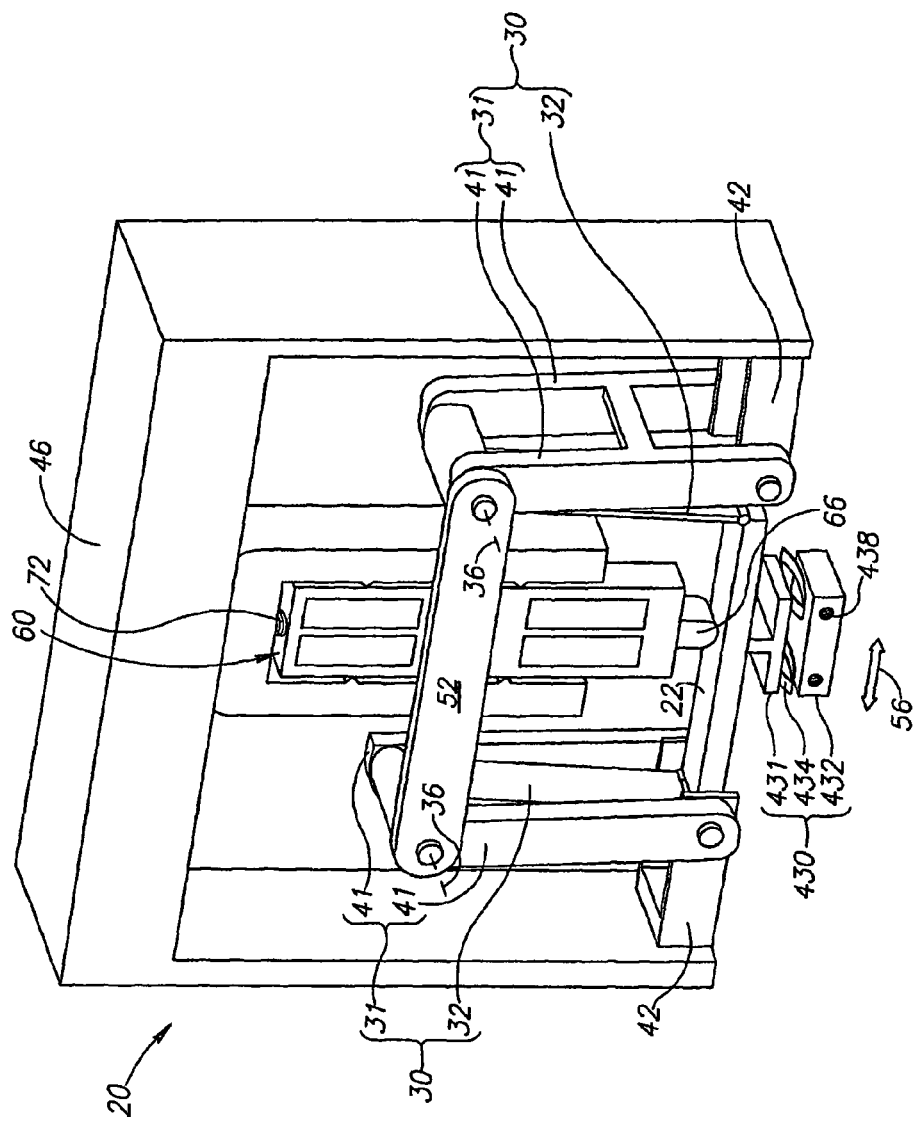
FIG. 1C schematically illustrates a method and apparatus for connecting double-pendulum transmission to a moveable body whose motion and position the transmission shown in FIGS. 1A and 1B is used to control, in accordance with an embodiment of the invention.

Piezoelectric motor 60 and double-pendulum transmission system 20 are coupled to control motion and position of a moveable element in directions indicated by double-head block arrow 56 by connecting motion bar 22 to the element. In some embodiments of the invention, motion bar 22 is connected to the moveable element using a resilient connector that tends to damp any motion of motion bar 22 relative to the moveable element in a direction perpendicular the plane that contains axes 36. Optionally, the resilient connector is similar to a resilient connector 430 schematically shown in FIG. 1C. Resilient connector 430 optionally comprises a "T" fin 431 connected to a base block 432 by optionally two leaf springs 434. Base block 432 is optionally used to connect connector 430 to the moveable body. Any of various devices and methods known in the art may be used to connect base block 432 to the moveable body. Optionally, the base block is formed having threaded holes 438 for connecting the base block and the moveable body using suitable bolts or screws having threads that match those of the holes.

Leaf springs 434 provide a relatively rigid coupling of motion bar 22 to the moveable element for motion of the bar in directions indicated by block arrow 56 and accurately transmit the motion in these directions to the moveable element. On the other hand, the leaf springs are relatively resilient for relative motion of the motion bar and moveable element in directions perpendicular to the plane that contains axes 36, and while enabling such relative motion, tend to damp the motion. It is noted that in general, forces generated by compression and extension of first and second pendulum arms 31 and 32 moderate a load on leaf springs 434 generated by resilient element 72 pressing friction nub 66 to motion bar 22. Resilient connector 430 provides a relatively low friction connection between motion bar 22 and the movable element.

Figure 1D:
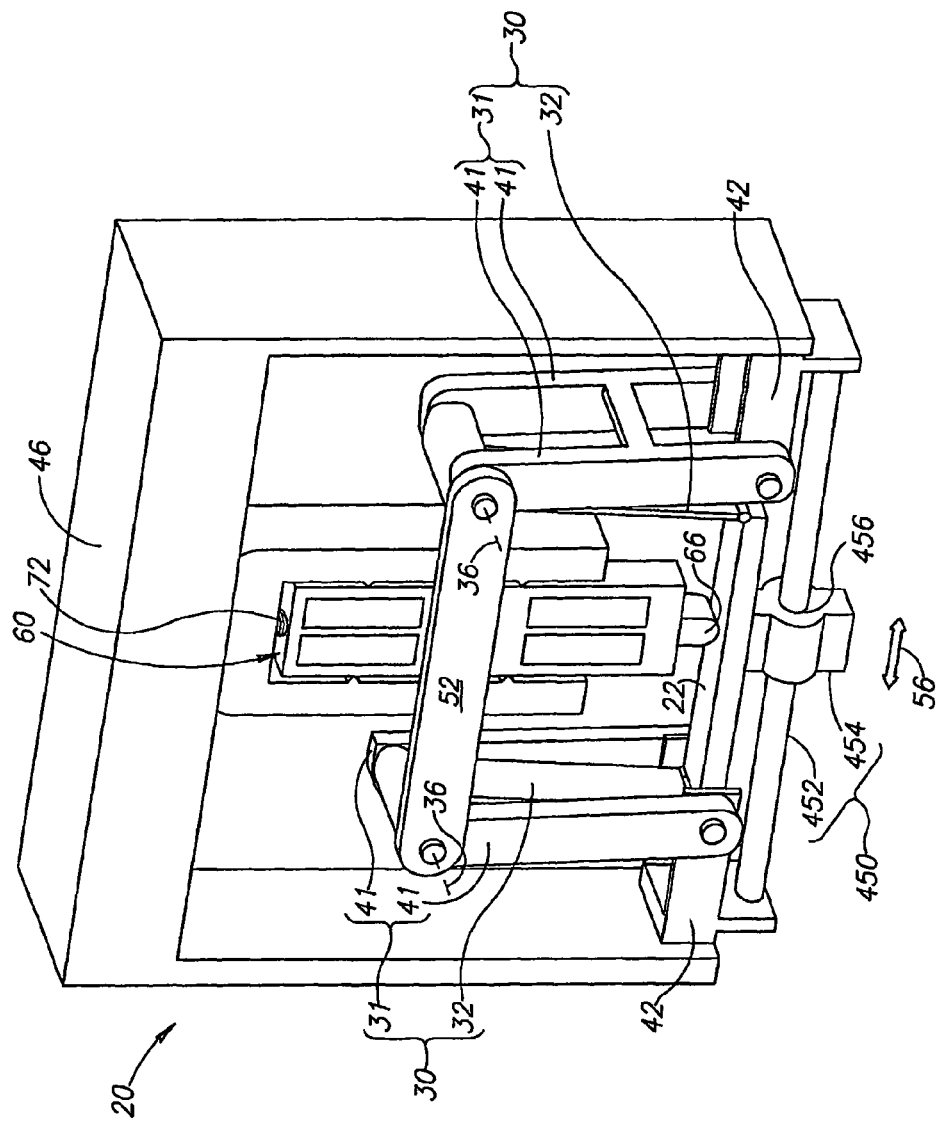
FIG. 1D schematically illustrates another method and apparatus for connecting double-pendulum transmission to a moveable body in accordance with an embodiment of the invention.

Other methods and device may of course be used to couple motion of motion bar 22 to a moveable element. For example, motion bar 22 may be connected to a movable element using a fin and rail connector 450 such as that shown in FIG. 1D. Fin and rail connector 450 comprises a rail 452 optionally connected to U shaped pendulum mounts 42 and a coupling fin 454 rigidly connected to motion bar 22 and formed having a hole 456 through which the rail passes. Rail 452 is parallel to motion bar 22. Fin 454 "rides" along on rail 452 and the plane that contains axes 36 arrow 56. Fin 454 is connected to the moveable element to couple the motion bar to the element.

It is noted that in the above embodiment the various joints are schematically shown as hinge joints, each having a shaft about which pieces connected by the hinge rotate. In some embodiments of the invention, at least one of the joints is a flexure joint in which the pieces are connected by a relatively thin "neck" that bends to allow the pieces to rotate about each other.

Figure 1E:
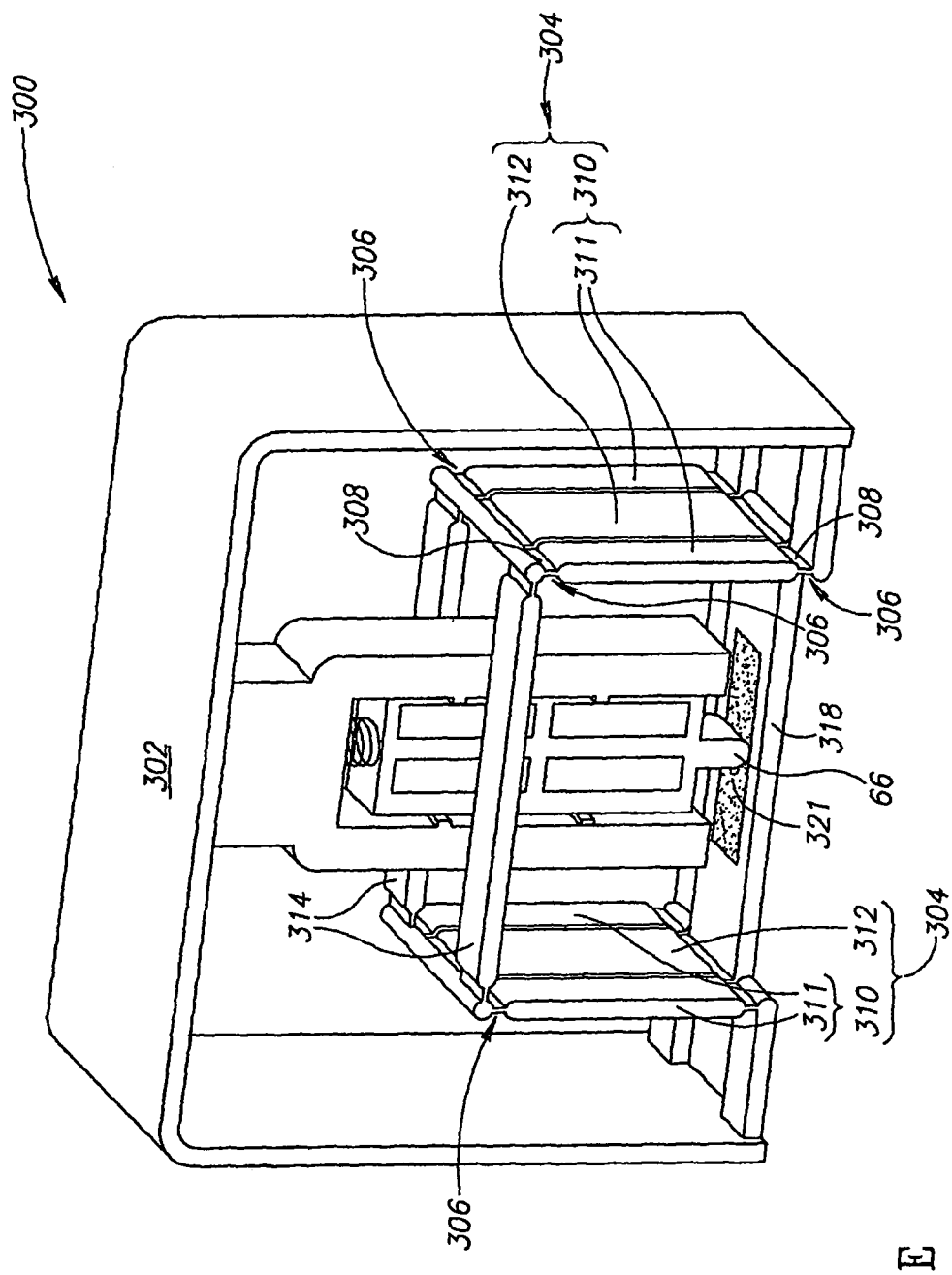
FIG. 1E schematically shows a perspective view of another coupled double-pendulum transmission system, in accordance with an embodiment of the present invention.

FIG. 1E schematically shows a coupled double-pendulum transmission 300 comprising a frame 302 and two coupled double-pendulums 304 in which, by way of example, all joints are flexure joints 306, each connecting two pieces with a relatively thin tongue 308 formed from a resilient material. Each double-pendulum 304 corresponds to double-pendulum 30 in FIG. 1A and comprises a first arm 310 comprising two struts 311 that correspond to first arm 31 and its struts 41 in FIG. 1A and a second arm 312 corresponding to first arm 32 in FIG. 1A. First arms 310 are coupled by at least one coupling bar 314 connected to corresponding struts 311 of the arms and second pendulum arms 312 are connected to a motion bar 318.

Optionally, some components of coupled double-pendulums 304 are formed by injection molding a suitable plastic or plastics. In some embodiments of the invention, substantially all, or all the components of the coupled double-pendulum arms are formed by injection molding. In some embodiments the double-pendulum arms and features requiring flexibility, such as flexure joints 306, are injection molded from a flexible, relatively soft and inexpensive plastic such as polypropylene. Other components requiring rigidity and impact resistance, such as motion bar 318 that contacts friction nub 66 of motor 60, are optionally formed from a suitable hard, high impact plastic such as PEEK. Optionally, only a part of the component, that which is subject to the impact and wear, is formed the hard high impact plastic by over-molding the hard plastic on a softer plastic that forms the remainder of the component. For example, in FIG. 1E motion bar 318, which is assumed to be formed from a relatively soft plastic, e.g. polypropylene, is over molded with, an impact resistance plastic such as PEEK in a region 321 where piezoelectric motor's friction nub 66 contacts the motion bar. In the figures, over-molded plastic is shown shaded.

Figure 2A:
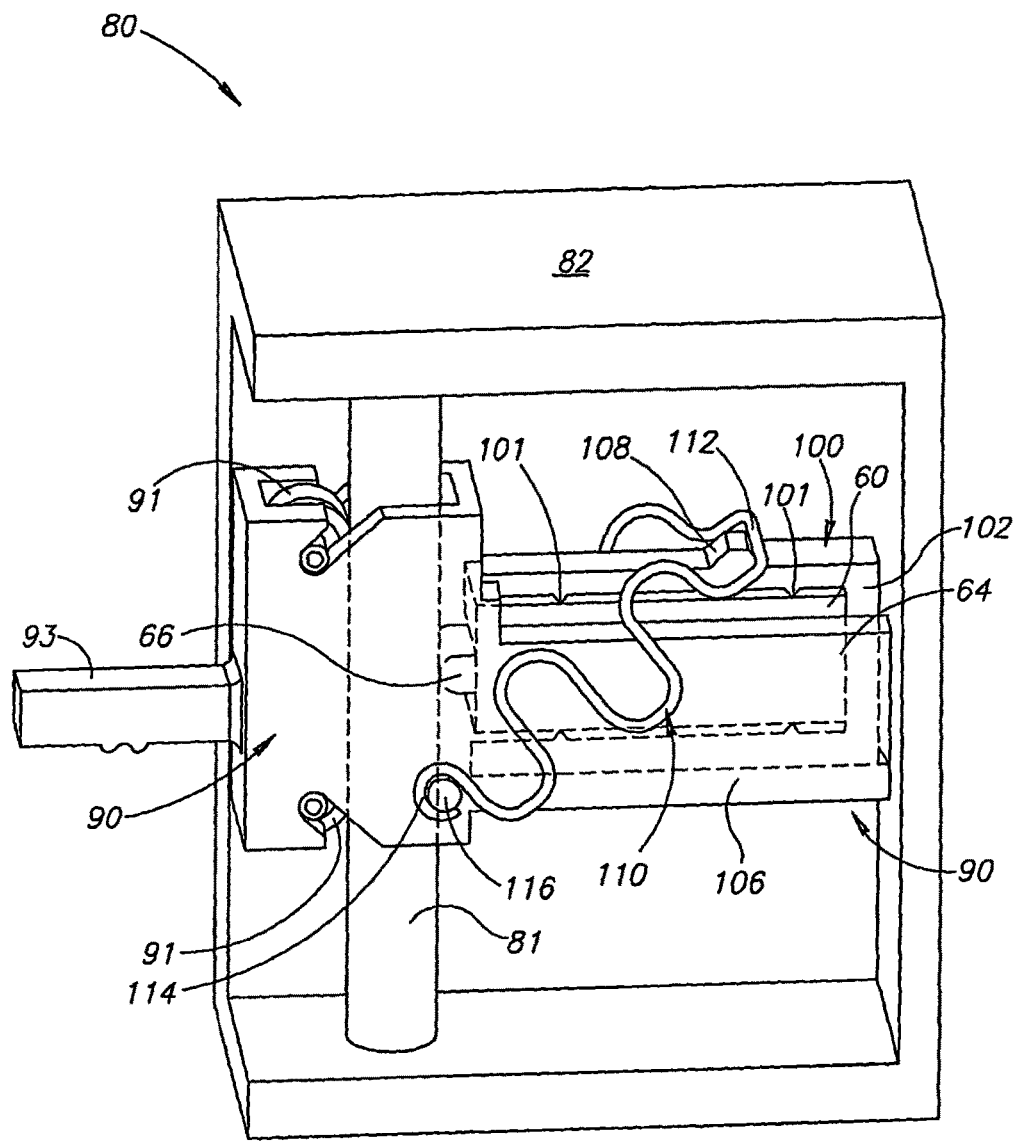
FIG. 2A schematically shows a rail-rider transmission system, in accordance with an embodiment of the invention.

FIG. 2A schematically shows a perspective, partially cutaway view of a rail-rider transmission system 80, in accordance with an embodiment of the invention. Features of rail-rider transmission 80 that are germane to the discussion and not normally seen in the perspective of FIG. 2A are shown in ghost lines.

Rail-rider transmission 80 comprises a drive-rail 81 and a motion housing 90 configured to move freely along the drive-rail. Optionally, to provide free motion of motion housing 90 along drive-rail 81, the motion housing comprises at least one bearing, such as a suitable low friction contact bearing or a roller bearing that contacts the drive-rail. Optionally, at least one bearing comprises two grooved bearing wheels 91 that roll freely along the drive-rail. Drive-rail 81 is fixedly mounted to a suitable frame or transmission housing 82 that optionally houses motion housing 90.

In an embodiment of the invention motion housing 90 comprises a motor frame 100 to which a piezoelectric motor 60, optionally similar to the piezoelectric motor shown in FIG. 1A, is mounted. Piezoelectric motor 60 is mounted to motor frame 100 using any of various methods known in the art and is held relatively rigidly in the frame. Optionally, motor frame 100 comprises mounting nubs 101 that contact edges of piezoelectric motor 60 at nodal points along the edges. Optionally, a back edge 64 of the piezoelectric motor 60 butts up snugly against a back bar 102 of motor frame 100. Motor frame 100 rests on a "motor shelf" 106 in motion housing 100 and is free to slide along the motor shelf.

In an embodiment of the invention, motor frame 100 comprises a spring catch 108 and housing 90 is optionally formed having eyelet pegs 116 on opposite sides of the housing. Only one of eyelet pegs 116 is shown in the perspective of FIG. 2A. A spring 110 formed having a catch bar 112 and eyelets 114, only one of which is seen in the perspective of FIG. 2A, is mounted to motion housing 90 by looping the eyelets over eyelet pegs 116 and the catch bar so that it is held by spring catch 108. Spring 110 applies a resilient force to motor frame 100 along a direction substantially parallel to a direction from spring catch 108 to an eyelet peg 116. A component of the force is perpendicular to the drive-rail 81 and resiliently presses the motor frame and thereby friction nub 66 of piezoelectric motor 60 to drive-rail 81 and the drive-rail to grooved bearing wheels 91. As a result, motion housing 90 is firmly coupled to the drive-rail. A component of the force is substantially parallel to drive-rail 81 and resiliently presses motor frame 100 to motor shelf 106.

It is noted that whereas housing 90 and motor frame 100 are shown configured to cooperate with spring 110, a resilient element or elements having form different from that of spring 110 may be used in the practice of the invention and the housing and motor frame configured accordingly. For example, a pair of coil springs may be used to replace spring 110. Housing 90 and motor frame 100 may optionally be formed with "anchor holes" in place of eyelet pegs 116 for receiving ends of the coil springs to secure the springs to the housing and frame.

Piezoelectric motor 60 is controllable to generate motion, optionally vibratory motion, in friction nub 66 that applies force to drive-rail 81 to move the motor and motion housing 90 selectively in either direction along the drive-rail. The component of force that spring 110 applies to motor frame 100 reduces backlash when the motor is controlled to reverse direction of motion along drive-rail 81. Motion housing 90 is optionally formed with a coupling tooth 93 for coupling motion of the motion housing to a moveable body.

In the configuration of an embodiment of the invention shown in FIG. 2A, spring 110 "draws" or "pulls" motor frame 100 to guide rail 81 to couple piezoelectric motor 60 to the guide rail. Other methods and devices may of course be used to couple the motor to the guide rail. For example, in an embodiment of the invention, a resilient element may be used to push rather than pull a motor frame similar to motor frame 100 to guide rail 81. In such an embodiment a motor housing comprising the motor frame is configured with a suitable backstop against which the element exerts force in order to push the motor. In some embodiments of the invention, the piezoelectric motor is not held in a motor frame but is mounted directly to the motion housing. Any of various methods known in the art for urging a piezoelectric motor relative to a housing that holds the motor may be used to resiliently urge the motor relative to the motion housing to couple the motor to the guide rail. For example, a method shown in PCT application PCT/IL2005/001055, the disclosure of which is incorporated herein by reference, may be used to urge the motor to the guide rail.

Figure 2B:
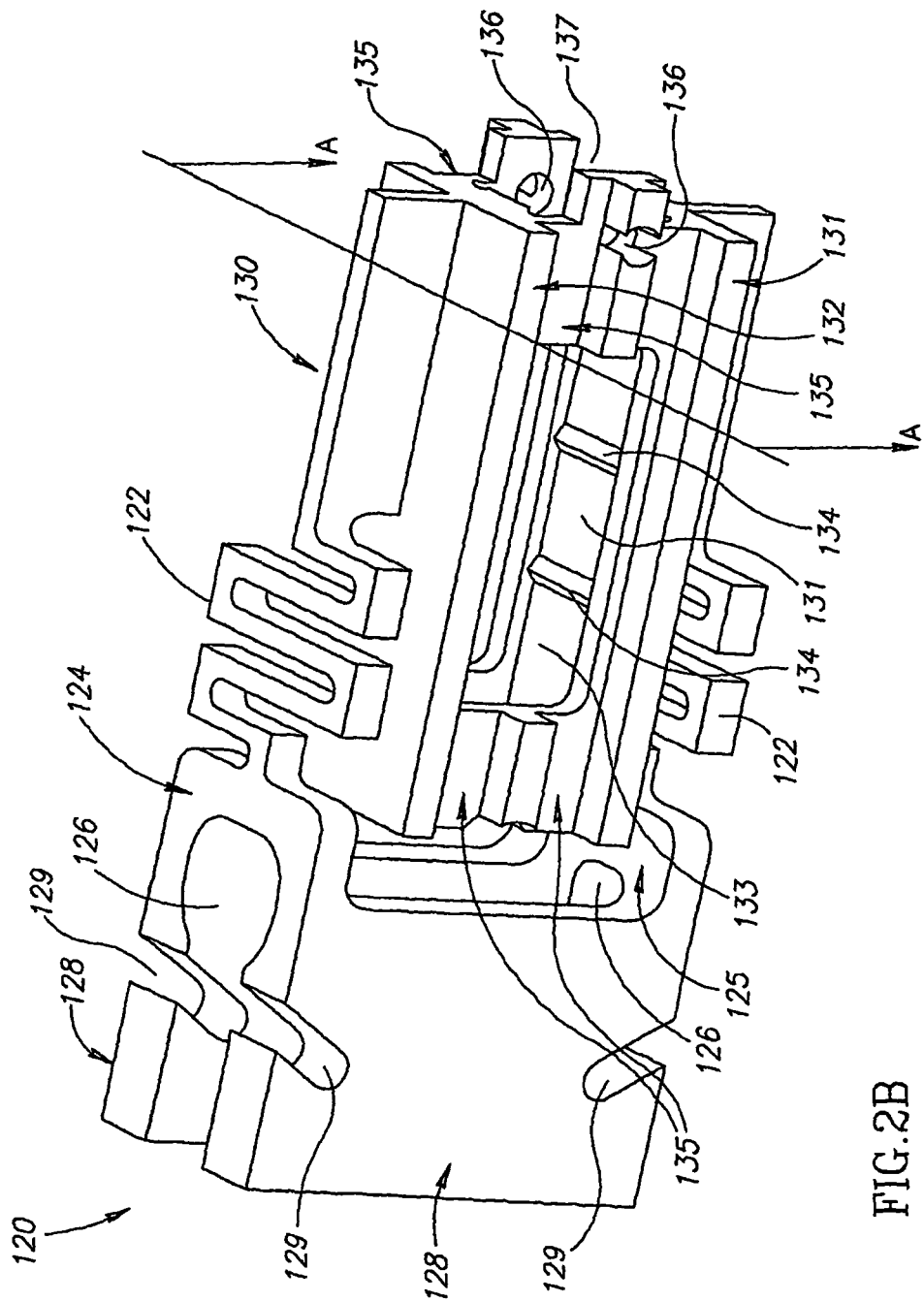
FIG. 2B schematically shows the rail-rider system shown in FIG. 2A coupled to move and position a lens in an optical system, in accordance with an embodiment of the invention.

In an embodiment of the invention, a motion housing comprises a resilient element, optionally integrally formed with the housing, that presses a piezoelectric motor mounted in the motion housing to a drive-rail of a rail-rider transmission similar to that shown in FIG. 2A. FIG. 2B schematically shows a motion housing 120 comprising, optionally, "accordion springs" 122 that are integrally formed with the housing and function to couple the housing and a piezoelectric motor mounted in the housing to a drive-rail.

Housing 120 comprises a piezoelectric motor frame 130 formed having a motor cavity 133 for receiving a piezoelectric motor optionally similar to piezoelectric motor 60 shown in FIGS. 1A and 2A. Housing 120 optionally comprises a top drive-rail panel 124 formed having a drive-rail hole 126 for receiving a drive-rail and an optionally mirror image bottom drive-rail panel 125 formed with a matching drive-rail hole 126. Top and bottom panels 124 and 125 are optionally connected to piezoelectric motor frame 130 by accordion springs 122. Optionally the motor frame has top and bottom motor frame panels 131 and 132 each formed having motor mounting nubs 134 that contact edges of a piezoelectric motor inserted into housing cavity 133 at nodal points along the motor edges. Motor mounting nubs 134 are shown in the perspective of FIG. 2B only for bottom panel 131. Sidewalls 135 optionally connect top and bottom motor frame panels 131 and 132 and a "back pair" of the sidewalls are optionally formed having holes 136 for receiving a motor locking pin. The motor is optionally inserted into cavity 133 from a motor insertion opening 137 and optionally locked in place by a locking pin inserted into holes 136 that prevents the motor from being pushed out of the cavity once it is inserted.

Housing 120 optionally has two forward side panels 128, each formed optionally with axle slots 129 for receiving an axle of a bearing or wheel. Axle slots 129 formed in one side panel 128 are optionally mirror images of the axle slots in the other side panel 128. Only one of the axle slots is shown in the perspective of the figure for the side panel 128 farther from the reader. Drive-rail holes 126 are shaped so that a drive-rail inserted in the holes is not held firmly by the walls of the holes but allow the drive-rail to displace freely towards and away from axle slots 129.

To mount a piezoelectric motor to motion housing 120 and a drive-rail to the motion housing, the drive-rail is inserted into drive-rail holes 126 and, optionally, bearing wheels that contact and roll along the drive-rail mounted to the housing. A bearing wheel is mounted to housing 120 by pressing or sliding the bearing wheel axle into a pair of axle slots 129. A piezoelectric motor is then inserted into motor cavity 133 so that its friction nub contacts the drive-rail. A locking pin is then inserted into holes 136 to lock the motor in place. In order to insert the locking pin into its holes, force must be applied to accordion springs 122 so that they stretch sufficiently to allow the locking pin to clear the body of the inserted piezoelectric motor.

Figure 2C:
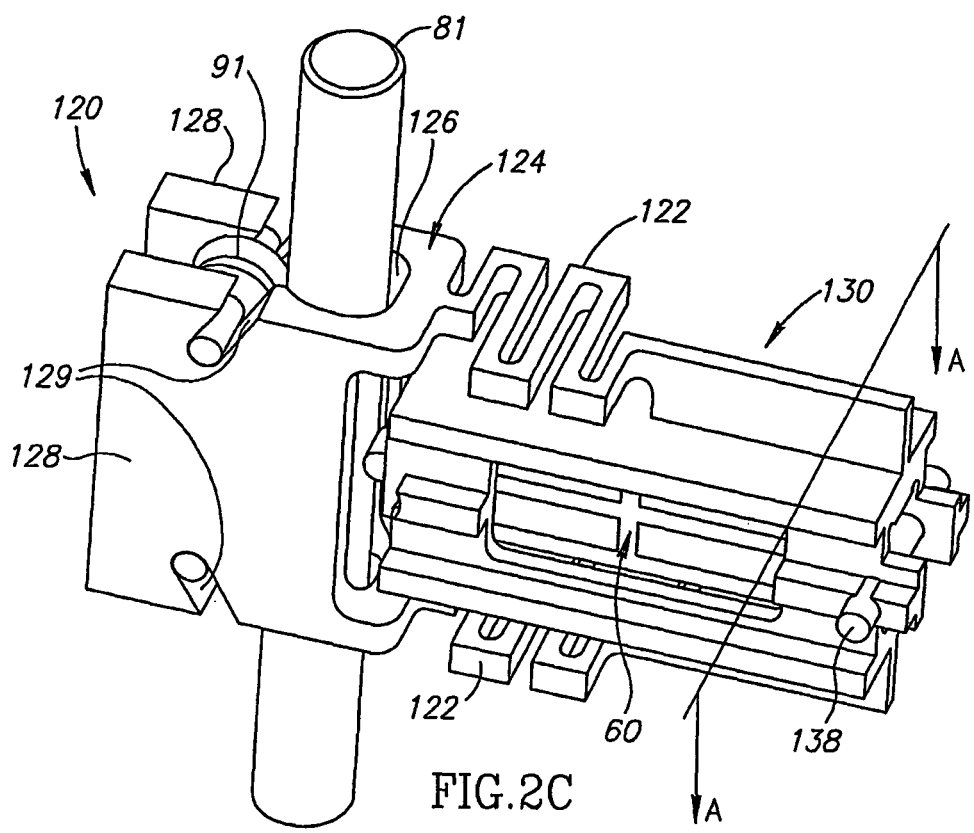
FIG. 2C schematically shows a piezoelectric motor housing comprising a resilient component that is an integral part of the housing for coupling a piezoelectric motor to a drive-rail in a rail-rider transmission system, in accordance with an embodiment of the present invention.

FIG. 2C schematically shows a drive-rail 81 mounted to motion housing 120, grooved bearing wheels 91 mounted in axle slots 129 and a piezoelectric motor 60 inserted into motor frame 130. A locking pin 138 locks piezoelectric motor 60 in place and accordion springs are slightly extended and resiliently press the motor to drive rail 81.

Figure 2D:
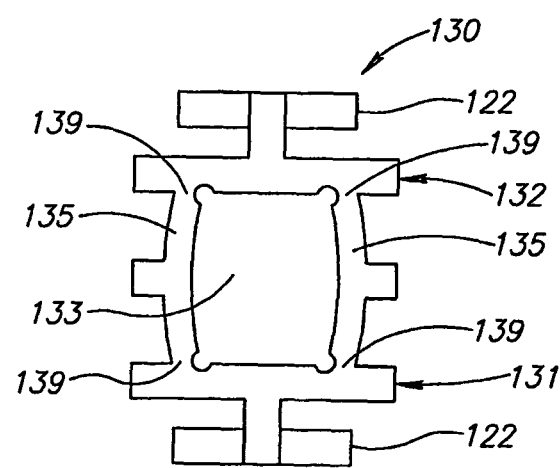
FIG. 2D schematically shows another piezoelectric motor housing comprising a resilient component that is an integral part of the housing for coupling a piezoelectric motor to a drive-rail in a rail-rider transmission system, in accordance with an embodiment of the present invention.

In accordance with an embodiment of the invention, sidewalls 135 are formed slightly convex. The convexity of sidewalls 135 is exaggerated for convenience of presentation and schematically shown in FIG. 2D, which shows a cross section of motor frame 130 taken along a plane indicated by line AA in FIG. 2B and FIG. 2C. Sidewalls 135 are joined to top and bottom panels 132 and 131 at "thinned out" junctions 139. The convexity and thinned out junctions 139 are provided to ease insertion of a piezoelectric motor into motor cavity 133.

During insertion, forces are applied to the sidewalls to squeeze them inward and increase a distance by which top and bottom housing panels 132 and 131 are separated.

Thinned out junctions 139 facilitate the relative motion of the sidewalls and top and bottom panels 132 and 131 when the sidewalls are squeezed. The increased distance increases a distance that separates motor mounting nubs 134 (FIG. 2B) in bottom panel 131 from their corresponding mounting nubs in top panel 132 and allows the motor to be pushed into motor cavity 133 relatively easily. After the motor is in place, the forces squeezing sidewalls 135 are released, the sidewalls relax towards their original convex configuration and the distance between the motor mounting nubs decrease until the motor mounting nubs press firmly to the edges of the motor.

Figure 3A:
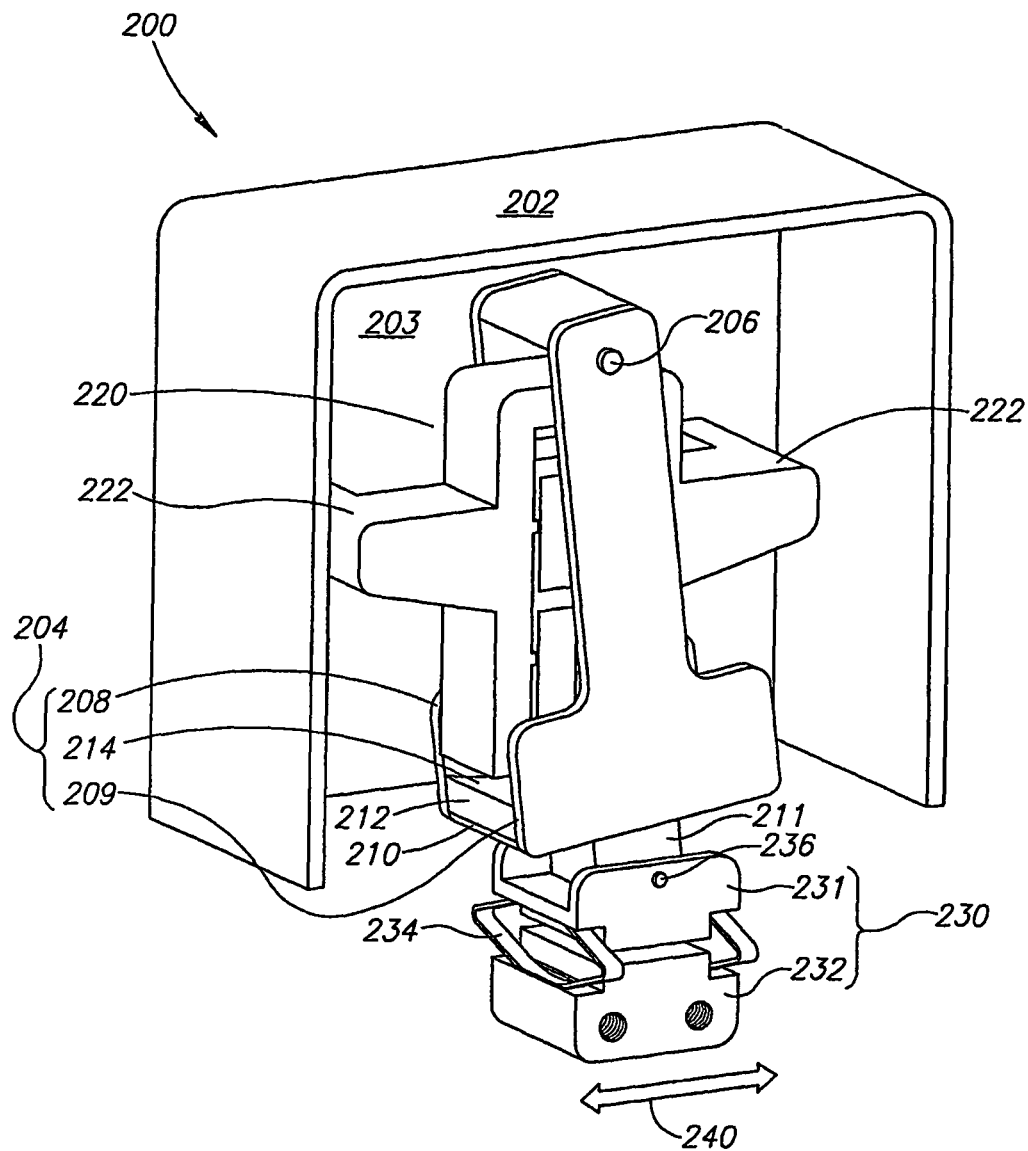
FIGS. 3A and 3B schematically show a pendulum transmission system in accordance with an embodiment of the present invention.

FIG. 3A schematically shows a pendulum transmission 200 in accordance with an embodiment of the invention.

Figure 3B:
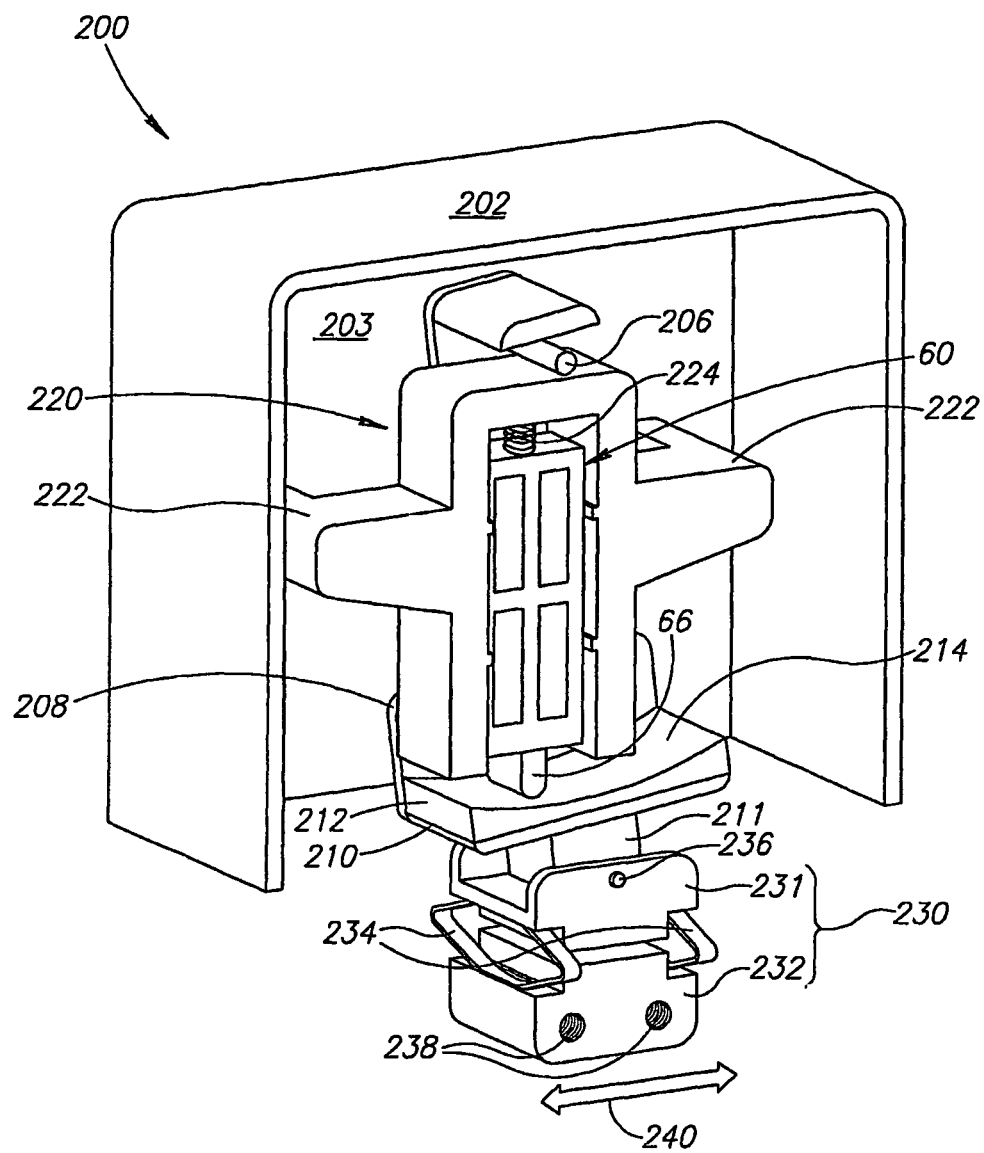

Pendulum transmission 200 optionally comprises a transmission housing 202 mounted with an arm 204, hereinafter a "pendulum", that is free to rotate about a shaft 206 mounted to a back wall 203 of the housing. Pendulum 204 optionally comprises two optionally mirror image planar panels 208 and 209 connected at their ends far from shaft 206 by a support panel 210. FIG. 3B schematically shows pendulum transmission 200 with planar panel 209 removed to show features of transmission 200 that are hidden by the panel. A coupling plate 212 having an optionally cylindrical contact surface 214 (FIG. 3B) facing shaft 206 is mounted to support panel 210. Optionally cylindrical contact surface 214 is a circularly cylindrical surface having a center of curvature substantially coincident with the axis of shaft 206.

A piezoelectric motor 60, optionally similar to piezoelectric motor 60 shown in FIG. 1A is mounted to transmission housing 202 so that it is located between panels 208 and 209. The motor 60 is optionally held in a "U" shaped motor frame 220 having two wings 222 that are mounted to wall 203 of transmission housing 202. Optionally a resilient element 224 mounted in motor frame 220 urges piezoelectric motor 60 so that its friction nub 66 resiliently contacts contact surface 214. Any of various methods known in the art may be used to mount piezoelectric motor 60 to motor frame 220 and resiliently urge the motor so that friction nub 66 contacts contact surface 214. Piezoelectric motor 60 is controlled to generate motion in its friction nub 66 to apply force to contact surface 214 and rotate pendulum 204 selectively clockwise or counterclockwise about shaft 206.

Support panel 210 is coupled to a connector for coupling motion of pendulum 204 to a movable body whose motion and position piezoelectric motor 60 controls that enables rotational motion of the pendulum to transmit linear motion to the moveable body. Optionally the connector is a "rocker connector" 230 that comprises a rocker 231 connected to a base block 232 by two leaf springs 234. A pin 236 that passes through rocker 231 and a keel 211 on support panel 210 couples the support panel to rocker connector 230. Base block 232 is used to connect rocker connector 230 to the moveable body. Any of various devices and methods known in the art may be used to connect base block 232 to the moveable body. Optionally, the base block is rigidly connected to the moveable body. By way of example, in FIGS. 3A and 3B base block 232 is shown having threaded holes 238 for connecting the base block and the moveable body using suitable bolts or screws having threads that match those of the holes.

Rocker connector 230 functions to allow rotational motion of pendulum 204 about shaft 206 to translate the moveable body without generating undue force that might rotate the body and perturb it motion from being linear. For example, assume that base block 232 is rigidly connected to a body that piezoelectric motor 60 controls to selectively move to the right or to the left along a linear trajectory in directions indicated by double-head block arrow 240. The motor rotates pendulum 204 clockwise to move the body to the left and counterclockwise to move the body to the right. When pendulum 204 rotates clockwise, not only does it move the body to the left, but also tends to move the body along an arc centered on shaft 206. To moderate this tendency, rocker 231 rotates counterclockwise and leaf springs 234 expand relative to their shape when the pendulum is not rotated at all (i.e. it is at the "6 o'clock" position, neither rotated clockwise or counterclockwise). Similarly, when the motor rotates pendulum 204 counterclockwise, rocker 231 rotates clockwise and leaf springs 234 expand relative to their 6 o'clock shape.

Figure 3C:
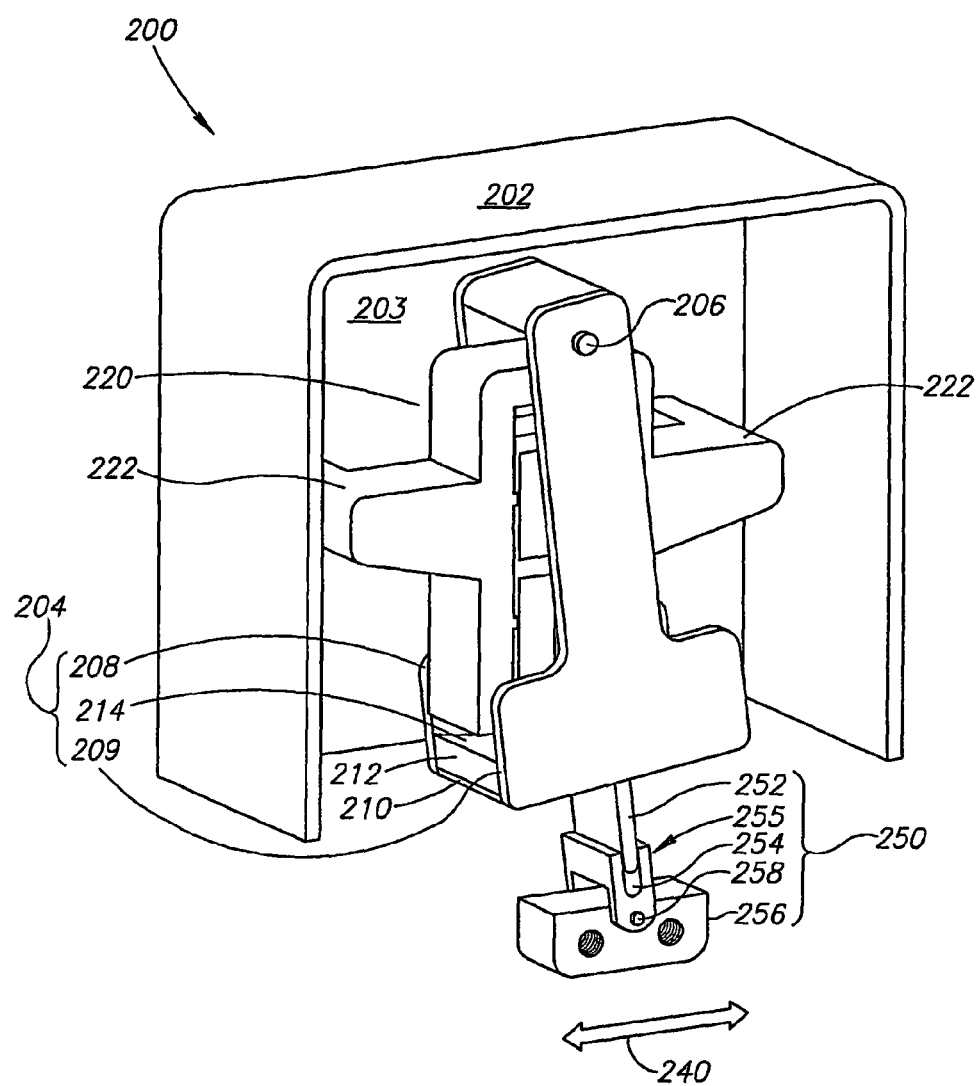
FIG. 3C schematically shows a variation of the pendulum transmission system shown in FIGS. 3A and 3B, in accordance with an embodiment of the present invention.

Methods and devices for coupling rotational motion of pendulum 204 to a moveable body to provide linear motion to the body that are different from those shown in FIGS. 3A and 3B may be used on the practice of the present invention. For example, FIG. 3C schematically shows pendulum 204 coupled to a "tongue in slot" connector 250 for coupling the pendulum to a moveable body. Tongue in slot connector 250 comprises a tongue 252 rigidly connected to support panel 210. The tongue is slidingly slotted into a slot 254 formed in a slot lug 255. Slot lug 255 is connected to a base block 256 optionally by a pin 258 so that the slot lug is rotatable about the pin. Base block 256 is optionally rigidly connected to the moveable body so that rotational motion of pendulum 204 generates linear motion in the moveable element.

Figure 4A:
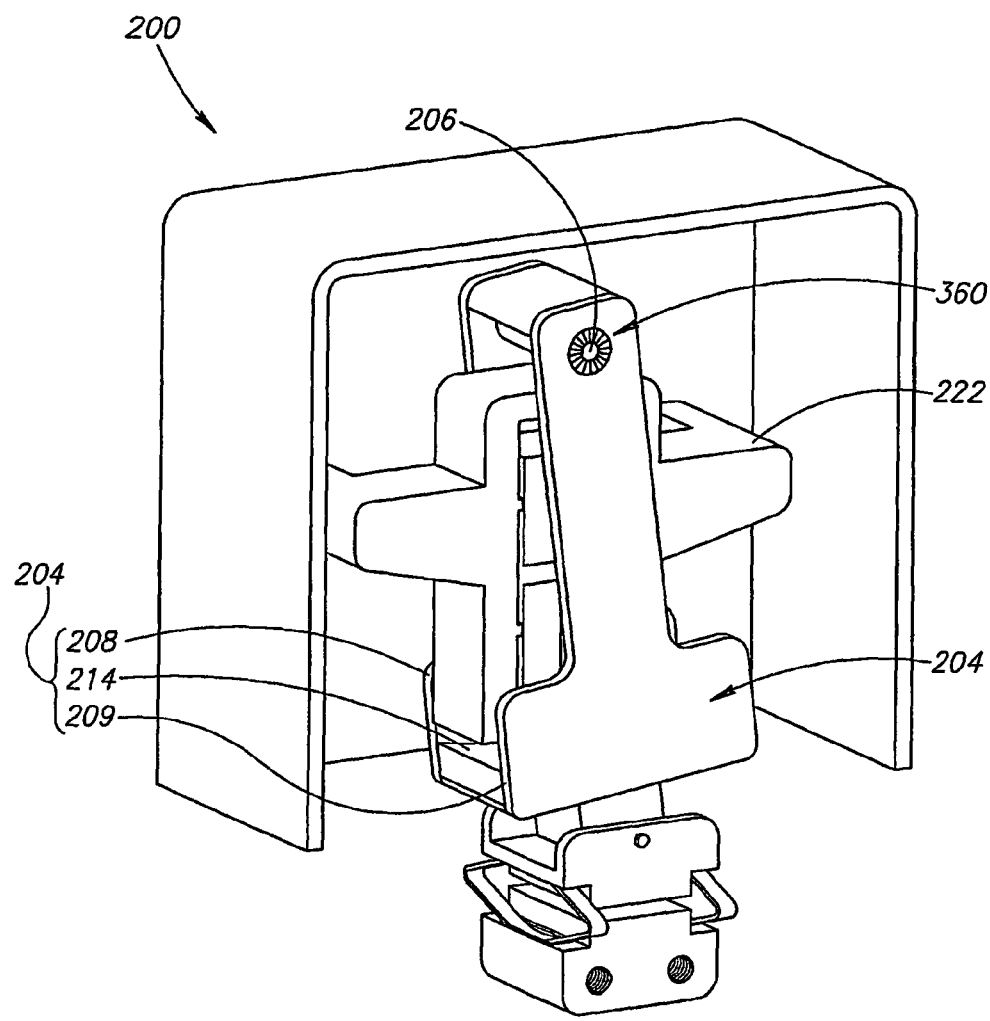
FIGS. 4A-4E show and schematically illustrate a pendulum transmission similar to that shown in FIGS. 3A and 3B in which the pendulum of the transmission is mounted to a shaft using a bushing, in accordance with an embodiment of the invention.

In some embodiments of the invention, an element mounted to a shaft so that it rotates about the shaft axis is mounted to the shaft with an inventive bushing, hereinafter referred to as a "vane" bushing. FIG. 4A schematically shows a vane bushing 360 in accordance with an embodiment of the invention used to mount pendulum 204 shown in FIG. 3A to shaft 206 about which the pendulum rotates. Details of bushing 360 are illustrated in FIGS. 4B-4E.

Figure 4B:
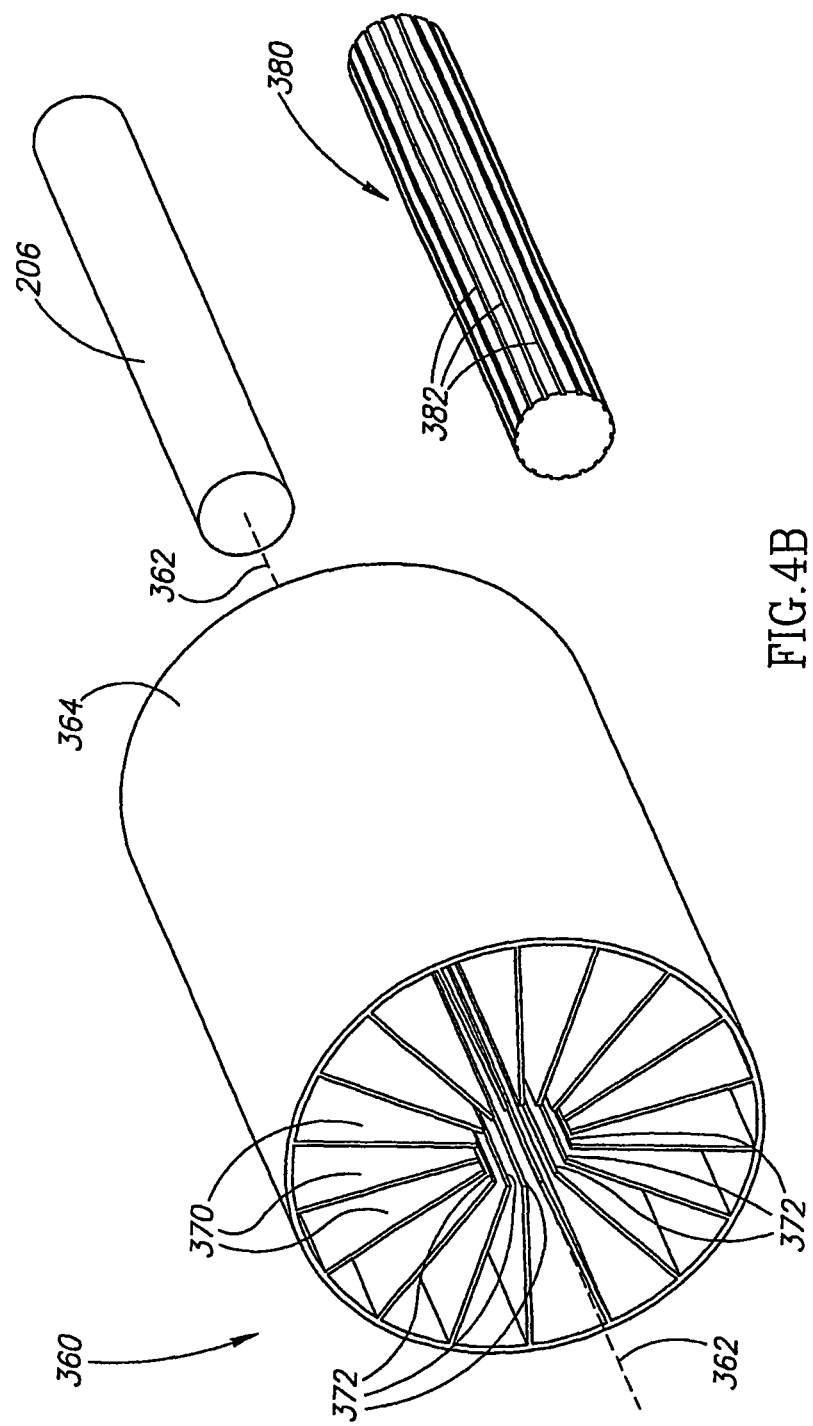

FIG. 4B schematically shows a perspective view of vane bushing 360 and shaft 206 to which the vane bushing is mounted, in accordance with an embodiment of the invention. Vane bushing 360 comprises a plurality of planar vanes 370 each having a straight "contact" edge 372 parallel to and located at a same distance from a common axis 362. The plane of each vane 370 lies along a radial direction of axis 362 and, optionally, an azimuth angle relative to the axis between the planes of any two adjacent vanes 370 is the same. The vanes are mounted to an optionally cylindrical housing 364. A radius of shaft 206 is such that the shaft may be pressed into the space between contact edges 372 of vanes 370 so that the shaft fits "snuggly" between the edges without substantially distorting the shape or orientation of the vanes. Generally, the radius of the shaft is substantially equal to the distance of each contact edge 372 from axis 362. Bushing 360 is mounted to shaft 206 by aligning the shaft axis so that it is substantially coincident with axis 362 and pressing the shaft into the bushing so that it contacts and seats between contact edges 372 of vanes 370. Whereas shaft 206 is shown in FIG. 4B having a smooth surface, in some embodiments of the invention a shaft, such as shaft 380 shown in the figure, to which bushing 360 is mounted has a surface formed with grooves 382 parallel to the shaft axis. Contact edges 372 of vanes 370 seat into the grooves when shaft 380 is pressed into the bushing.

Figure 4C:
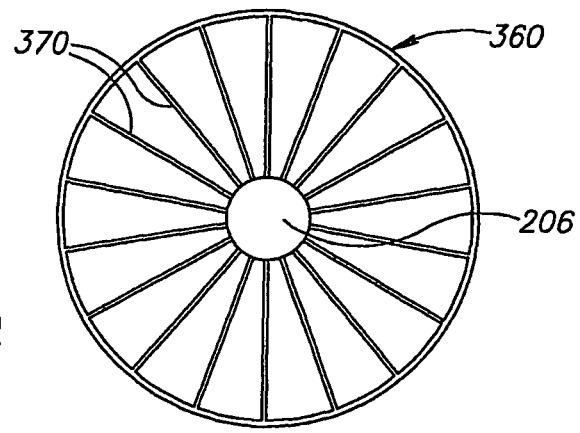
Figure 4D:
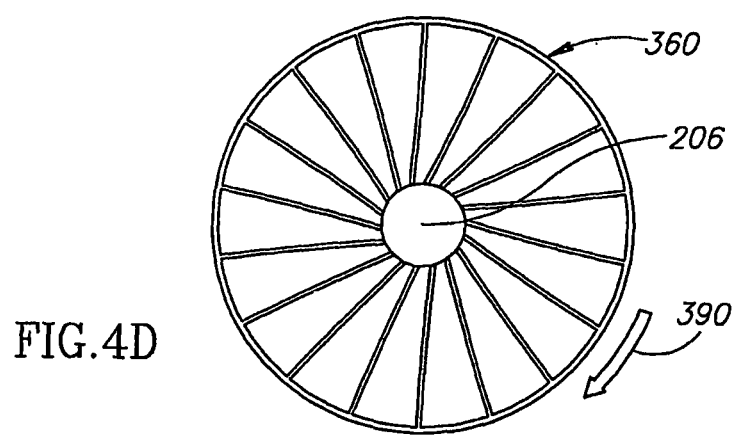
Figure 4E:
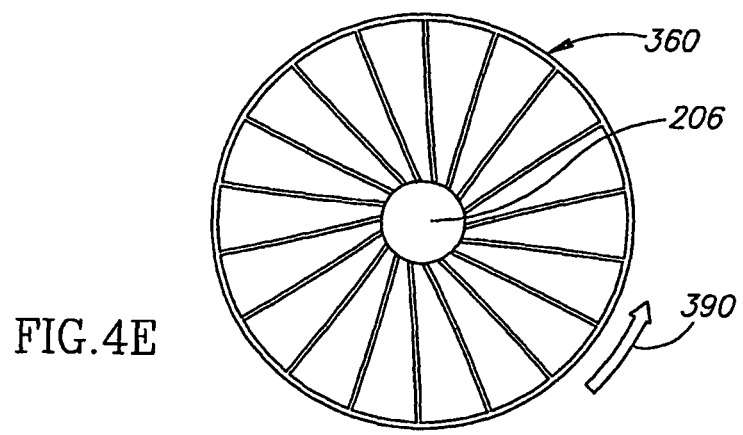

In accordance with an embodiment of the invention, vanes 370 are formed from a resilient material that enables rotation of bushing 360 relative to shaft 206 or 380 through a limited angular dynamic range of rotation substantially without contact edges 372 of vanes 370 sliding relative to the surface of the shaft. Instead, for relative angular displacements within the dynamic range of rotation, the planes of vanes 370 rotate away from their respective radial directions and/or the vanes bend so that they are no longer planar. FIGS. 4C-4E schematically show bushing 360 and shaft 206 end-on, and illustrate bending and orientation and configuration of vanes 370 for respectively no relative rotation of the bushing and shaft and clockwise and counterclockwise relative rotations. A block arrow 390 indicates direction of rotation of bushing 360 relative to shaft 206 in FIGS. 4D and 4E.

It is noted that because contact edges 372 hold shaft 206 with little or substantially no slippage relative to the surface of the shaft for rotations within the dynamic range of rotation, bushing 360 is a relatively low friction bushing. Optionally, bushing 360 is formed by injection molding a suitable plastic. Optionally, the bushing or components of the bushing are integrally formed with an element that the busing couples to a shaft.

Whereas vane bushing 360 is shown having vanes 370 mounted to a vane housing 364 and shaft 206 being inserted into a space between vane ends 372, a vane bushing in accordance with an embodiment of the invention can have other configurations. For example, a vane bushing in accordance with an embodiment of the invention can have vanes mounted to a shaft rather than to a housing. The shaft and vanes have dimensions that match a cavity formed in a housing and the shaft is coupled to the housing by pushing the shaft and its vanes into the housing cavity.

In the description and claims of the present application, each of the verbs, "comprise" "include" and "have", and conjugates thereof, are used to indicate that the object or objects of the verb are not necessarily a complete listing of members, components, elements or parts of the subject or subjects of the verb.

The invention has been described with reference to embodiments thereof that are provided by way of example and are not intended to limit the scope of the invention. The described embodiments comprise different features, not all of which are required in all embodiments of the invention. Some embodiments of the invention utilize only some of the features or possible combinations of the features. Variations of embodiments of the described invention and embodiments of the invention comprising different combinations of features than those noted in the described embodiments will occur to persons of the art. The scope of the invention is limited only by the following claims.

The invention claimed is:

1. Apparatus for transmitting motion to a moveable body comprising:
   a guide rail;
   a piezoelectric motor having a coupling surface for coupling the motor to the guide rail; and
   a housing comprising:
      at least one bearing that contacts a first side of the guide rail;
      at least one resilient element that urges the motor so as to press the motor coupling surface to a second side of the guide rail opposite the first side; and a coupler that couples the housing to the moveable body; wherein the piezoelectric motor is controllable to apply force to the guide rail to selectively translate the housing in either direction along the guide rail and thereby move the body,
   wherein the housing comprises a motor frame mounted to the housing that holds the motor and is free to move towards and away from the guide rail.

2. Apparatus according to claim 1 wherein the at least one resilient element urges the frame towards the guide rail.

3. Apparatus according to claim 1 wherein the housing comprises a motor frame support on which the motor frame rests and is free to slide towards and away from the guide rail.

4. Apparatus according to claim 1 wherein the resilient element comprises a pair of resilient elements that connect the motor frame to the housing and resiliently draw the motor frame toward the at least one bearing in a direction substantially perpendicular to the guide rail so that the coupling surface contacts a second side of the guide rail opposite the first side.

5. Apparatus according to claim 4 wherein only the resilient elements connect the frame to the housing.

6. Apparatus according to claim 3 wherein the at least one resilient element urges the frame towards the motor support.

7. Apparatus according to claim 6 wherein the at least one resilient element comprises two resilient elements, one on each side of the motor frame, which are connected by a bar.

8. Apparatus according to claim 7 wherein the resilient elements are planar elements.

9. Apparatus according to claim 7 wherein the resilient elements are substantially parallel.

10. Apparatus according to claim 7 wherein the motor frame has a catch that holds the resilient element to the motor frame.

* * * * *